United States Patent [19]

Yoritomo et al.

[11] Patent Number: 4,827,290
[45] Date of Patent: May 2, 1989

[54] LED ARRAY HEAD USING A FIBER BUNDLE

[75] Inventors: Makoto Yoritomo, Ohbuke; Masashi Fuse, Morioka; Shinji Murata, Iwate, all of Japan

[73] Assignee: Alps Electric Co., Ltd., Japan

[21] Appl. No.: 102,537

[22] Filed: Sep. 29, 1987

[30] Foreign Application Priority Data

Nov. 27, 1986 [JP] Japan ............................ 61-182595[U]

[51] Int. Cl.⁴ ............................................... G01D 9/42
[52] U.S. Cl. .................................. 346/107 R; 346/160
[58] Field of Search ................... 346/107 R, 108, 160; 250/560, 561

[56] References Cited

U.S. PATENT DOCUMENTS 4,633,271 12/1986 Segawa ............................ 346/107 R
4,700,206 10/1987 Yamakawa ........................... 346/108

Primary Examiner—E. A. Goldberg
Assistant Examiner—Mark Reinhart
Attorney, Agent, or Firm—Guy W. Shoup; Paul J. Winters

[57] ABSTRACT

An LED array head has an LED array which selectively emits light. The LED array is mounted on a substrate in a flip chip form with a light emitting section located opposed to a surface of the substrate. A fiber bundle including a plurality of optical fibers is buried in the substrate with an end portion of the fiber bundle located at a position in the vicinity of the light emitting section of the LED array.

2 Claims, 1 Drawing Sheet

LED ARRAY HEAD USING A FIBER BUNDLE

BACKGROUND OF THE INVENTION

1. Field of the Invention

The present invention relates to an LED array head for use with an apparatus such as an LED printer using an electrophotography process.

2. Description of the Prior Art

FIG. 3 shows a schematic explanatory diagram of an LED printer including an LED array head.

In the structure of this diagram, reference numeral 1 indicates a photosensitive drum made of a photoconductive material and rotates in a direction indicated by an arrow mark. The drum 1 is uniformly and electrically charged by means of a charger 2 and is then subjected to an exposure by an LED array head 3 according to the recording image information, thereby forming an electrostatic latent image on the drum 1. In a developer 4, the latent image is developed to attain a toner image, which is transcribed or transferred onto a sheet of paper 6 by an operation of a transcriber or transfer unit 5. The sheet of paper 6 onto which the toner image has been transferred is fed to a fixing apparatus 7, where the toner image is fixed on the sheet of paper 6. On the other hand, after the transfer operation is finished, the photosensitive drum 1 is cleaned by a cleaner 8 for subsequent usage.

The LED array head 3 is, as will be described later, includes an array of LED elements in which a lot of light-emitting diode (LED) chips are arranged in a direction of the character printing operation and a rod lens array of the self-convergence type for converging light radiated from the LED elements of the LED array and for exposing the photosensitive drum 1 to the light.

In the prior art LED array head 3 used in the LED printer above, as shown in FIG. 4, an LED chip 22 is disposed on a ceramic substrate 21 by die bonding and wire bonding is applied to each LED light emitting section so as to supply electric power thereto. Moreover, a cover glass 26 is mounted on a heat dissipating plate 23 made of aluminum or the like to protect bonding wires connected to the LED chip 22 and a conductor pattern on the ceramic substrate in which the LED chip 22 is mounted, and a retaining member 25 retaining the rod lens array of the self-convergence type is supported on the heat dissipating plate 23, thereby configuring the LED array head.

In the LED array head described above, when mounting an LED chip on the ceramic substrate, a positioning precision of about 10 $\mu$m is necessary, for example, with respect to the linearity of the positioning. Due to the large dimensions of the chip width and the width of the die bonding pad, for example, the chip width is about 0.7–1 mm and the dibonding pad has a width of about 1.2–1.5 mm, an optical method using a TV camera or the like is indispensable for the positioning operation, which deteriorates the efficiency of the die bonding of the LED chip and further requires use of an expensive apparatus to mount the LED chip.

In addition, the wire bonding must be effected one time for each light emitting section of the LED (usually, 64 light emitting sections are formed in an LED chip). For example, for an LED array of an A4-letter size manufactured with an ordinary integration density of 300 DPI (about 12 dots/mm), 2560 wire bonds are necessary. In this case, consequently, even when a high-speed wire bonder is adopted, a period of time of about 40 minutes to one hour is required for the wire bonding operation. Furthermore, if there exists even one wrong bonding in the 2560 wire bonds, the overall LED array is assumed to be rejected and hence this operation must be effected with a special care, which lowers the production efficiency and causes the production cost to be increased.

Moreover, since a high precision of $\pm 100$ $\mu$m is required for alignment of the LED chip of the LED array head and the fluctuation of the linearity of the light emitting sections in the direction of the height thereof each with respect to the direction of the width (216 mm for the A4-sized LED array head), the warping and bending of the ceramic substrate itself in restricted. As a consequence, a high-precision ceramic substrate is necessary and each ceramic substrate must be subjected to a selection; consequently, the price of the substrate is soared.

In addition, since the rod lens array of the self-convergence type is retained on a heat dissipating plate with a ceramic substrate disposed thereon, there may appear a disadvantage that the dimensional errors of these components are accumulated and hence the necessary precision cannot be obtained. At present, the positioning precision of the rod lens array of the self-convergence type is $\pm 0.1$ mm along the entire length of the rod lens array, it is indispensable to optically confirm the positioning precision and to provide the LED array head with a mechanism enabling the high-precision positioning, which leads to an increase of the production cost associated with the number of assemblage processes, the manufacturing facility, the number of components, and the like.

SUMMARY OF THE INVENTION

It is therefore an object of the present invention to provide a low-priced LED array having a simple configuration, thereby removing the problems described above.

In order to achieve the object, according to the present invention, the LED array is mounted on a substrate in the flip chip form in which the emitting sections are arranged to oppose the surface of the substrate and the light emitting sections of the LED array and a fiber bundle comprising a plurality of optical fibers is buried in the substrate with an end portion of the fiber bundle located in the vicinity of the light emitting sections.

An effect of the means described above is as follows.

Since the LED chip is mounted on the surface of the substrate in the flip chip form, wire bonding is unnecessary. Furthermore, since the fiber bundle including plural optical fibers is directly buried in the substrate, the number of the components can be reduced and hence the mechanism is simplified.

BRIEF DESCRIPTION OF THE DRAWINGS

The present invention will be apparent from the following detailed description taken in conjunction with the accompanying drawings in which.

DESCRIPTION OF THE PREFERRED EMBODIMENT

Figure 1:
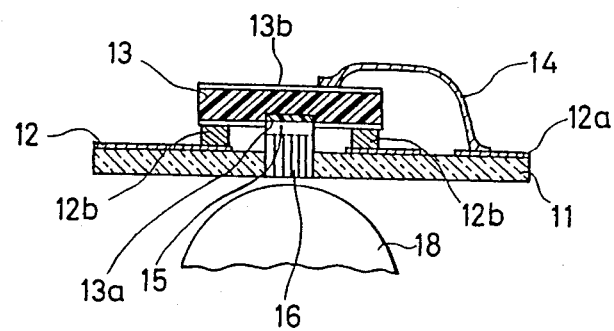
FIG. 1 is a cross-sectional diagram illustrating the structure of an LED array head of an embodiment of the present invention.
Figure 2:
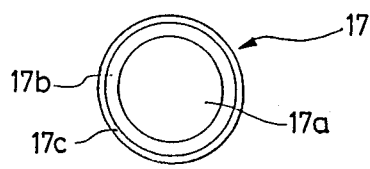
FIG. 2 is a cross-sectional view showing an optical fiber of the embodiment.
Figure 3:
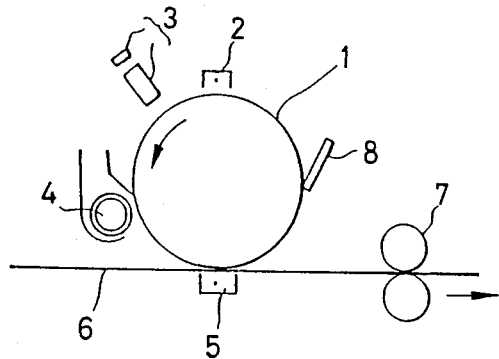
FIG. 3 is a structural diagram schematically illustrating the configuration of an ordinary LED printer.
Figure 4:
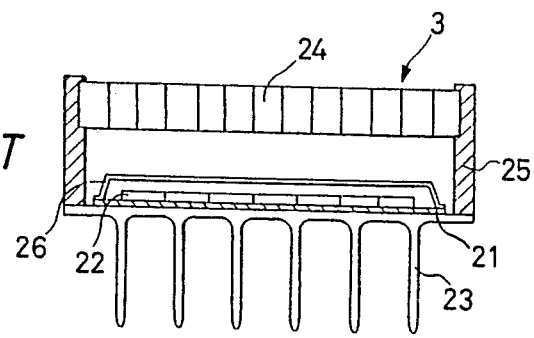
FIG. 4 is a cross-sectional diagram illustrating the structure of a conventional LED array head.

Referring now to FIGS. 1 and 2, an embodiment of the present invention will be described.

In FIG. 1, reference numeral 11 indicates a transparent substrate made of a glass or the like. A desired fine conductor pattern 12 is formed on the surface of the substrate 11 by use of a thin film process. On the conductor pattern 12, an LED chip 13 is disposed by use of a solder bump 12b with a light emitting section 13a located to oppose the substrate 11. An electrode 13b on a rear surface of the LED chip 13 is conductively linked to an earth pattern 12a of the substrate 11 by means of a lead wire 14. Moreover, the light emitting section 13a of the LED chip 13 is located, via a transparent synthetic resin 15, in the vicinity of an end portion 16a of a fiber bundle 16 with a structure in which a plurality of optical fibers 17 each having a diameter of 10-25 μm are gathered. Incidentally, the fiber bundle 16 is buried in the substrate 11 so as to be retained therein. Moreover, the optical fiber 17 comprises, as shown in FIG. 2, a 3-layer structure including a core 17a made of a glass having a high value of the refractive index, a clad 17b manufactured with a glass having a low value of the refractive index in the periphery of the core 17a, and an absorber 17c made of carbon or the like in the periphery of the clad 17b.

In the LED array head configured as described above, the light radiated from the light emitting section 13a of the LED chip 13 enters the fiber bundle 16 via the end portion 16a thereof and is transmitted through the fiber bundle 16 with a high efficiency so as to be radiated onto the surface the object 18 to be exposed to the light such as a photosensitive drum.

According to the present invention in which the LED array is configured as described above, the following effects are obtained.

(1) Since the LED chip is mounted on a transparent substrate in the flip chip form, the wire bonding process required in the prior technique is unnecessary, thereby reducing the number of processes.

(2) Particularly, when a glass substrate is used, due to the smoothness of the surface thereof, a fine pattern can be easily generated in the thin film process; furthermore, a high-precision substrate not having the warping and the like can be easily obtained, which facilitates high precision in positioning the LED chip.

(3) Since the optical fiber does not have such a focus possessed by the rod lens array of the self-convergence type, the distance between the light emitting section of the LED array and the object can be reduced and hence the system can be miniaturized.

(4) Since a substantial portion of the light radiated from the light emitting section of the LED array enters the fiber bundle and is efficiently radiated onto the object, the energy to emit the light to be supplied to the LED array can be minimized, which elongates the life of the LED array.

While the present invention has been described with reference to the particular illustrative embodiment, it is not restricted by the embodiment but only by the appended claims. It is to be appreciated that those skilled in the art can change and modify the embodiment without departing from the scope and spirit of the invention.

What is claimed is:

1. An LED array head comprising:
    an LED array which selectively emits light, said LED array being mounted on a substrate in a flip chip form with a light emitting section located to oppose a surface of the substrate, and
    a fiber bundle including a plurality of optical fibers having no self-convergence characteristic, said fiber bundle being buried in the substrate with an end portion of said fiber bundle located at a position in the vicinity of the light emitting section of said LED array.

2. An LED array head according to claim 1, wherein said substrate is transparent and made of glass.

* * * * *

UNITED STATES PATENT AND TRADEMARK OFFICE
CERTIFICATE OF CORRECTION

PATENT NO. : 4,827,290

DATED : May 2, 1989

INVENTOR(S) : Makoto Tomoyori, Masashi Fuse, Shinji Murata

It is certified that error appears in the above-identified patent and that said Letters Patent is hereby corrected as shown below:

On the title page

Correct name of first inventor -- MAKOTO TOMOYORI --.

Signed and Sealed this

Thirtieth Day of January, 1990

*Attest:*

JEFFREY M. SAMUELS

*Attesting Officer*     *Acting Commissioner of Patents and Trademarks*